United States Patent
Russell et al.

(10) Patent No.: US 7,674,707 B2
(45) Date of Patent: Mar. 9, 2010

(54) MANUFACTURABLE RELIABLE DIFFUSION-BARRIER

(75) Inventors: Noel M. Russell, Plano, TX (US); Satyavolu Srinivas Papa Rao, Poughkeepsi, NY (US); Stephan Grunow, Poughkeepsie, NY (US)

(73) Assignee: Texas Instruments Incorporated, Dallas, TX (US)

( * ) Notice: Subject to any disclaimer, the term of this patent is extended or adjusted under 35 U.S.C. 154(b) by 65 days.

(21) Appl. No.: 11/968,093

(22) Filed: Dec. 31, 2007

(65) Prior Publication Data

US 2009/0166865 A1 Jul. 2, 2009

(51) Int. Cl.
*H01L 21/283* (2006.01)

(52) U.S. Cl. .................. 438/627; 438/643; 438/653; 204/192.17

(58) Field of Classification Search .............. 438/627, 438/643, 653, FOR. 350; 204/192.17; 148/33.3
See application file for complete search history.

(56) References Cited

U.S. PATENT DOCUMENTS

| | | | | |
|---|---|---|---|---|
| 5,108,569 | A * | 4/1992 | Gilboa et al. | 204/192.13 |
| 6,790,323 | B2 * | 9/2004 | Fu et al. | 204/192.17 |
| 2002/0008017 | A1 * | 1/2002 | Fu | 204/192.17 |
| 2005/0208767 | A1 * | 9/2005 | Ding et al. | 438/685 |
| 2008/0145907 | A1 * | 6/2008 | Benson et al. | 435/174 |

* cited by examiner

*Primary Examiner*—George Fourson
(74) *Attorney, Agent, or Firm*—Jacqueline J. Garner; Wade J. Brady, III; Frederick J. Telecky, Jr.

(57) ABSTRACT

Devices and methods are presented to fabricate diffusion barrier layers on a substrate. Presently, barrier layers comprising a nitride layer and a pure metal layer are formed using a physical vapor deposition (PVD) process that requires multiple ignition steps, and results in nitride-layer thicknesses of no less than 2 nm. This invention discloses devices and process to produce nitride-layers of less than <1 nm, while allowing for formation of a pure metal layer on the nitride-layer without re-igniting the plasma. To achieve this, the flow of nitrogen gas is cut off either before the plasma is ignited, or before the formation of a continuous-flow plasma. This ensures that a limited number of nitrogen atoms is deposited in conjunction with metal atoms on the substrate, thereby allowing for controlled thickness of the nitride layer.

16 Claims, 2 Drawing Sheets

MANUFACTURABLE RELIABLE DIFFUSION-BARRIER

BACKGROUND OF THE INVENTION

1. Field of the Invention

The present invention relates generally to semiconductor fabrication. More particularly, the present invention relates to the creation of a diffusion barrier layer on a substrate using physical vapor deposition (PVD).

2. Background of the Invention

As microelectronics continue to miniaturize, interconnection performance, reliability, and power consumption have become increasingly important. Interest has grown in replacing aluminum alloys with lower resistivity and higher reliability metals. Copper offers a significant improvement over aluminum as a contact and interconnect material. For example, the resistivity of copper is about half of the resistivity of aluminum. However the use of copper as an interconnect material present various problems not encountered with the use of aluminum because of the inherent properties of copper and its reaction with silicon and other various dielectrics employed in semiconductor fabrication. One of the problems is that copper will likely result in diffusion in the silicon or dielectric layer when placed in contact with silicon or dielectric. This diffusion can lead to the destruction of the underlying circuitry as well as an increase in electromigration. In addition copper does not bond well with the silicon or most dielectrics.

To solve the problem associated with the use of copper, manufactures of semiconductors have employed the use of a metal barrier layer between the copper contacts and interconnects and underlying material layers. Typically the metal barrier layer has two layers composed of a barrier layer to prevent the diffusion of copper and electromigration, and a wetting layer to enhance the adhesion of copper to the substrate. While a single layer of metal could serve to prevent diffusion and increase wettability, commonly a metal nitride is used for the barrier layer. This is because an increase in the nitrogen content of the metal nitride increases the protection against diffusion of copper into the substrate and electromigration. However, nitride layers do not provide the wettability of a pure metal. As such, dual layers are used to form the metal barrier layer. For instance the metal barrier layer could be composed of layers of titanium nitrate (TiN) and titanium (Ti). Typically metal barrier layers are composed of TiN/Ti, TaN/Ta, WN/W, and MoN/Mo. In addition, the use of a metal nitrate layer provides good adhesion to the silicon or dielectric medium.

One method of manufacturing the metal barrier layer is through physical vapor deposition (PVD), or more specifically through a form of PVD called sputtering. Deposition through sputtering is accomplished in an enclosed chamber, with a target electrode composed of at least part of the material to be sputter deposited and a substrate. A noble non-reactive gas such as argon is streamed through the chamber and is ignited to provide a plasma source. Sputtered particles traverse the chamber and stick to the substrate, forming a metal layer. To deposit the compound material, the chamber is additionally filled with a reactive gas to provide the additional compound elements. Sputtered particles chemically react with the reactive gas and are together deposited on the substrate as the compound material. For instance, to deposit Tantalum Nitride (TaN), the target would be formed from Ta and the chamber would be filled with a mixture of nitrogen gas and argon. The metal barrier layer is typically formed by repeating the sputtering process twice. The first time, nitrogen gas is introduced into the chamber with a metal target to produce a metal nitrite layer. The second time, the nitrogen is removed and a non-reactive gas such as argon is introduced, to produce a pure metal layer.

The metal barrier layer, while necessary when using copper, presents problems since it is more resistive than copper and hence leads to slower signal propagation and a slower device. This is particularly true of the nitrite layer as an increase of nitrogen cause the metal nitrate to be more resistive. As such, the thickness of the nitrite layer needs to be kept to a minimum to reduce the resistance. Also as chips become more miniature and smaller process are used in fabricating the chips, thinner metal barrier layers are need. For instance, in a 65 nm process, it is desirable for the nitrate layer to have a thickness of 1 nm or less.

However, when using sputtering, it is often difficult to consistently produce a layer of either metal or metal nitrate that is less than 2 nm in thickness. Nitrogen flows during and after ignition limit the minimum thickness, resulting in different nitrogen incorporation and properties. Thus, the typical 2-step sputtering is not a reliable process in manufacturing metal nitrates layers that are loss than 1 nm thick as needed for 65 nm and smaller process used to fabricate semiconductors. There exist other methods for manufacturing a thin film of a metal nitrite that is less than 1 nm thick. For instance, a thin film metal nitrate can be deposited using Atomic Layer Deposition (ALD). However this process is much more expensive than sputtering. In addition, the use of ALD to produce a barrier layer has not been proven in terms of reliability. What is needed is a reliable, inexpensive and effective method to produce a barrier layer consisting of a metal nitride whose thickness is less than 1 nm.

SUMMARY OF THE INVENTION

The present invention discloses devices and methods to form an ultra-thin nitrided metallization layer on a substrate, followed by a pure metallization layer. A Physical Vapor Deposition (PVD) process is improved by combining two separate steps to accomplish formation of a metal-barrier layer. Whereas in conventional techniques, nitrogen is introduced, plasma is ignited, a barrier layer is formed, plasma is extinguished, nitrogen is evacuated, and plasma is re-ignited to deposit a metallic layer, the present invention allows manufacture of a metal-barrier layer using only one ignition step. This is achieved by cutting off the flow of nitrogen gas at some point before the ignition step is completed. Thus, a nitride layer is formed using existing nitrogen atoms in the chamber, and a pure metallic layer is subsequently formed when no more nitrogen atoms are present. The nitride layer is formed during the ignition step only. This allows for a nitride barrier layer of controllable thickness that can reach <1 nm. This very low deposition rate process is integrated into the ignition step.

In one exemplary embodiment, the present invention is a method to form an ultra-thin nitride layer on a substrate. This is achieved by initially flowing nitrogen gas in a process chamber, stabilizing the chamber pressure as desired, igniting a DC-target bias component, and stopping the flow of nitrogen into the chamber before the ignition process is complete. The thickness of the nitride layer can thus be controlled by varying the point at which the nitrogen flow is stopped.

In another exemplary embodiment, the nitrogen gas flow is stopped before the ignition step begins. The pressure of the nitrogen gas is stabilized before the nitrogen flow is stopped. This allows for an even thinner nitride layer.

In another exemplary embodiment, the present invention is a method to form a metal-barrier layer comprising an ultrathin nitride layer in combination with a pure metal layer using a single ignition step. A substrate is placed in a PVD chamber along with a metallic target. A combination of gases comprising an inert gas and a reactive gas is introduced into the chamber. A specific ignition voltage is applied to the target to ignite the gas into plasma. Metallic atoms are ejected or "sputtered" from the target towards the substrate. On their way, the metallic atoms react with the nitrogen atoms to form a metallic nitride that is deposited on the substrate forming a nitride barrier layer. While the plasma is being ignited, the nitrogen flow is switched off. Alternatively, the nitrogen flow may be switched off before the plasma is ignited. Thus, the thickness of the nitride layer depends upon the number of nitrogen atoms remaining in the chamber. As the nitrogen atoms in the chamber get depleted, the density of nitride in the layer is reduced, until there are no more nitrogen atoms remaining in the chamber. At this point, metallic atoms continue being deposited on the substrate to form a pure metallic layer. Thus, a metal-barrier layer is formed in one step without having to flush gases in the chamber or reignite plasma.

DETAILED DESCRIPTION OF THE INVENTION

Figure 1A:
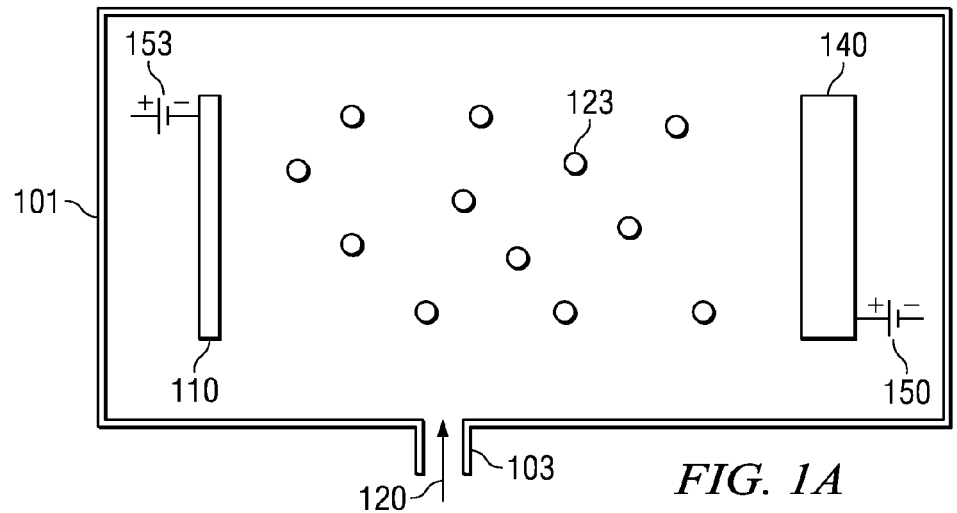
FIGS. 1A-C show a physical vapor deposition (PVD) process, according to an exemplary embodiment of the present invention.

The present invention discloses methods and devices to make a reliable diffusion barrier less than 1 nm thick that is produced using PVD sputtering. A wafer or a substrate is subjected to a deposition of metal nitride and a pure metal. A gas mixture comprising a reactive gas and a noble gas flows through the chamber at low pressure. An ignition phase starts the flow of plasma that disjoins metallic atoms from a target element. According to the present invention, the flow of reactive gas is stopped either before or during the ignition phase of the sputtering. Thus the flow of the reactive gas is completely stopped before the ignition phase of the sputtering is completed. This ensures that the nitride content of the deposited layer decreases as the layer is deposited on the surface of the substrate. Thus, a very thin layer of metal nitride is formed, wherein the nitride content reduces sharply as distance from the surface increases. Other benefits include improved process control, cost savings based on an inexpensive extension to a standard PVD process, while achieving improved Cu-barrier layer reliability.

For the purposes of the present invention, a "substrate" or "wafer" includes any thin slice of semiconducting material, such as a silicon crystal, upon which microcircuits are constructed by standard procedures, including doping, chemical etching, and deposition. Substrates may undergo Shallow Trench Isolation (STI), Chemical-Mechanical Planarization (CMP), lithography, ion implantation, deposition, and other processes.

Deposition through sputtering is typically accomplished in an enclosed chamber, with a target electrode composed of at least part of the material to be sputter-deposited and a substrate. The chamber is filled with a noble non-reactive gas such as argon and thereafter a steady stream is inserted into the chamber, the amount being determined by the rate of deposition desired. A negative DC bias is applied to the target electrode with respect to the substrate. The bias is sufficiently high to cause the argon to be excited or "ignited" to a plasma state. Often times a higher voltage needs be applied between the target and the substrate to ignite a plasma flow than is necessary to maintain a flow of plasma. The resultant plasma flows to the target and strikes it with sufficient energy to dislodge atomic sized clusters of target atoms from the target. That is, the target is sputtered. The sputtered particles travel ballistically across the chamber, and some of them strike and stick to the substrate, to thereby sputter deposit the target material on the substrate. For instance the target material could be composed of Ta, and thus the substrate would be deposited with Ta through the sputtering process. Furthermore, a reactive gas such as nitrogen may be introduced into the chamber to create a nitride layer. Thus to deposit Tantalum Nitride (TaN), the target would be formed from Ta and the chamber would be filled with a mixture of nitrogen gas and argon. The percent of nitrogen gas that fills the chamber would depend on the desired ratio of Ta to nitrogen in the TaN layer. The plasma would be formed and knock Ta particles from the Ta element, which would then react with the nitrogen gas in the chamber and form TaN. The new compound TaN is then continues to travel across the chamber and is sputter deposited on the substrate creating a TaN layer.

"Ignition" refers to the initial excitation of plasma. Ignition requires a high voltage to cause the working gas to be excited into the electrons and positive ions of an electron. This initial condition must persist for a time period, usually 1-2 seconds, and over a space sufficient to support a low-resistance, essentially neutral plasma between the two electrodes. Once a "continuous plasma flow" is created, the maintenance the continuous plasma flow requires a feedback condition in which at least as many argon atoms, if argon is the dominant gas, are excited into ions and electrons as are lost. This post-ignition maintenance process can also be referred to as "post-ignition deposition." Thus, the present invention involves cutting off the nitrogen flow either during the ignition step, or before the ignition step, but always before a continuous plasma flow is created.

A diffusion barrier layer is a metal nitride layer that is deposited on a substrate using PVD or any other deposition technique. A diffusion barrier layer or simply "barrier" comprises a metallic nitride layer, wherein the nitride compound is formed as the metallic atoms interact with nitrogen atoms on their way to the substrate.

Figure 1B:
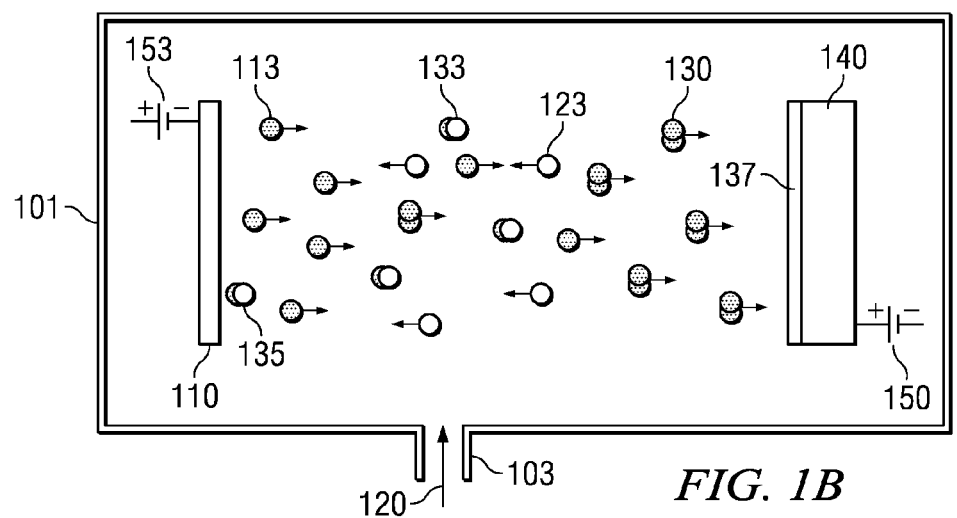
Figure 1C:
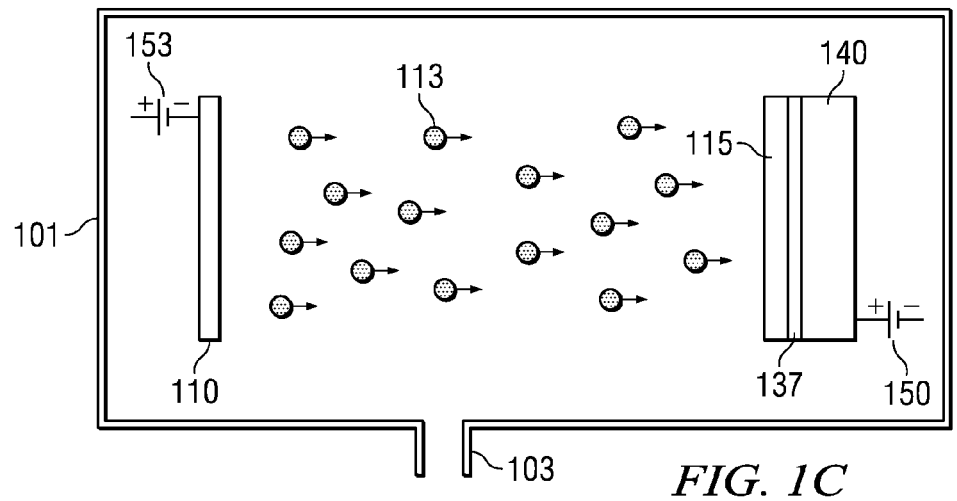

As described earlier, the present invention allows for an ultra-thin nitride layer and a metallic layer that cannot be produced using the typical 2-step process known in the art. A substrate is placed in a chamber and subjected to a deposition of metal nitrite and a pure metal to form a barrier layer between a silicone substrate or dielectric and an additional subsequent layer composed of a metal, typically copper. The deposition is done by sputtering, with the target element composing a metal, typically Ta, and a chamber being filled with a reactive gas such as nitrogen and a non-reactive gas such as argon. According to an exemplary embodiment of the present invention, turning off the reactive gas flow before or during the ignition step reduces the need to re-ignite the plasma to deposit a pure metallic layer, while ensuring the deposition of a thin nitride layer. FIGS. 1A-C show a process according to an exemplary embodiment of the present invention. FIGS. 1A-C show the effect over time of turning off the reactive gas flow during the ignition step. Chamber 101 has an inlet 103 for a reactive gas 120, a metallic target 110, and a wafer or substrate 140. Target 110 is connected to a negative terminal 153, and substrate 140 is connected to a positive terminal 150. Alternatively, substrate 140 is electrically insulated.

FIG. 1A shows the inside of chamber 101 before the ignition step is initiated. Reactive gas 120 is introduced into chamber 101. Reactive gas 120 may comprise molecules of Nitrogen, atoms of which are indicated by atoms 123. An inert noble gas such as Argon may also be present. At this point, electrodes 150, 153 are not active, and nitrogen atoms 123 have reached a specified pressure, determined by the overall thickness of nitride desired.

FIG. 1B shows the inside of chamber 101 when the ignition step is initiated. This involves activating electrode 153 to a point where the inert gas such as Argon ignites into a plasma (not shown) and positively charged argon ions are attracted to the negatively charged target 110. The plasma ions strike target 110 at a substantial energy and cause target atoms 113 to be sputtered from target element 110. Target atoms 113 flow towards the (relatively) positive anode substrate 140. While traversing chamber 101, target atoms 113 react and combine with nitrogen atoms 123. This reaction 133, 135 may occur at any point within the chamber between the target and the substrate. Combined atoms form a metallic nitride compound molecule 130. Nitride molecule 130 strikes substrate 140 and is thereby deposited on it, forming a film or nitride layer 137.

To ensure an ultra-thin nitride layer 137 (under 1 nm), the flow of nitrogen 120 through inlet 103 is cut off either before or during the ignition phase. This will gradually reduce the nitrogen concentration in chamber 101. Since nitride formation into film 137 depends on factors such as residence time of nitrogen in chamber 101, pump speed, etc., cutting off the nitrogen concentration results in nitride layers 137 that are thinner than those manufactured using conventional techniques. Furthermore, to achieve thicknesses of <1 nm, the target power is kept at 1-4 kilowatts and the wafer AC bias is unchanged. This provides ultra-thin nitride layer over a deposition time of 1-3 seconds.

FIG. 1C shows the inside of chamber 101 after the nitrogen flow has been cut off at inlet 103. Available nitrogen atoms have reacted with metallic atoms 113 to form an ultra-thin nitride layer 137 on substrate 140. At this point, the ignition step may be completed. This involves lowering target voltage 153 to a value that allows a sustained plasma flow to dislodge additional target atoms 113. This value is lower than the ignition voltage. At this point, remaining metallic atoms 113 traverse chamber 101 uninterrupted until they strike substrate 140 and are deposited as a pure metallic layer 115. The thickness of this pure metallic layer can be varied by techniques presently known in the art.

In another exemplary embodiment, the gas flow 120 is turned off before the ignition step is initiated in FIG. 1B. The purpose is to allow only the existing nitrogen atoms to react with metallic atoms 123 to form the nitride layer 137. Alternatively, gas flow 120 is turned off after the ignition is initiated but before ignition voltage is lowered. This allows for a larger number of nitrogen atoms to be deposited in the nitride layer 137. Stopping the flow of the reactive gas produces a very thin nitride layer where the nitrogen content of the layer decreases in proportion to the distance from the substrate. Since the ignition step is typically in the order of 1-2 seconds in duration, gas flow 120 can be cut off anytime before or within this period. Thus, the present invention encompasses a range of options to cut off the nitrogen flow, thereby allowing for finer control of the thickness of nitride layer 137.

An additional benefit of the present invention is apparent when used to deposit Tantalum Nitride (TaN) layers. The presented sputtering process will produce an almost pure Ta layer directly above and connected to the TaN layer that is most likely grown in the alpha crystal configuration. Tantalum has two crystalline phases: the low resistivity (12-20 micro-ohm-cm) alpha phase, and a higher resistivity (160-170 micro-ohm-cm) beta phase. A comparison of the effectiveness of thin bcc-Ta and beta-Ta layers as diffusion barriers to copper penetration into silicon shows that the bcc-Ta which exhibits low resistivity also performs well as a barrier layer up to 650 degrees Celsius. This Ta layer will provide good wettability for the subsequent copper layer and has low resistance. The present invention allows for use of sputtering in producing a metal nitrate layer of less than 1 nm that also produces a pure metal layer in the same sputtering sequence. Thus, this method allows for a barrier and wetting layer to be formed in the same sputtering sequence without having to remove a reactive gas or reignite a plasma to sputter deposit the metal barrier layer as in the prior art.

Figure 2:
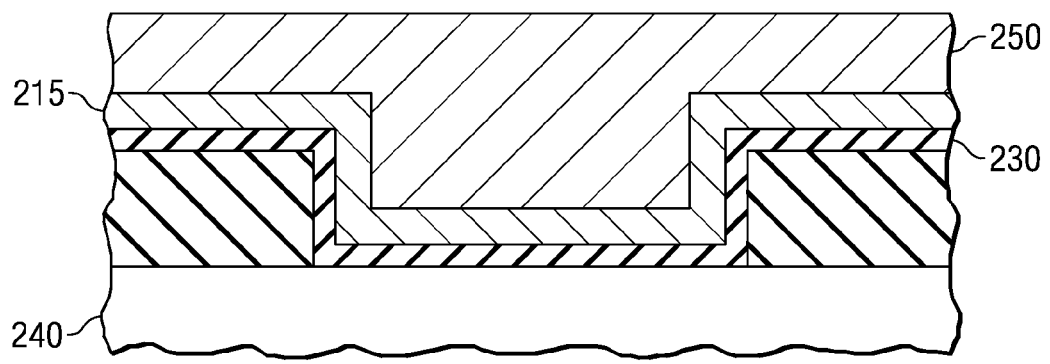
FIG. 2 shows a copper interconnect situated above a metal barrier layer, according to an exemplary embodiment of the present invention.

FIG. 2 shows a copper interconnect situated above a metal barrier layer, according to an exemplary embodiment of the present invention. Substrate 240 has undergone a PVD process as described herein. A nitride layer 230 such as TaN sits in a vertical connection, called a "via." According to the present invention, TaN layer 230 is ultra-thin, and is coupled with a pure Ta layer 215. Both layers together form a metal barrier layer, and have been created during a single PVD process utilizing a single ignition step. Since Ta layer 215 is formed over an ultrathin TaN layer 230, it is deposited in an alpha-phase, ensuring low resistivity and reliable barrier characteristics. Copper interconnect 250 is deposited using an etching mechanism that ensures via bottom cleaning without sputtering copper on the sidewalls, such as an EnCoRe etch. This ensures that the bottom of the via or channel is cleaned, without sputtering any copper onto the sidewall oxide of the substrate. This also prevents oxygen from being sputtered from the sidewall into underlying metal. Subsequent Ta depositions continue to form in the alpha phase (low resistivity).

Figure 3:
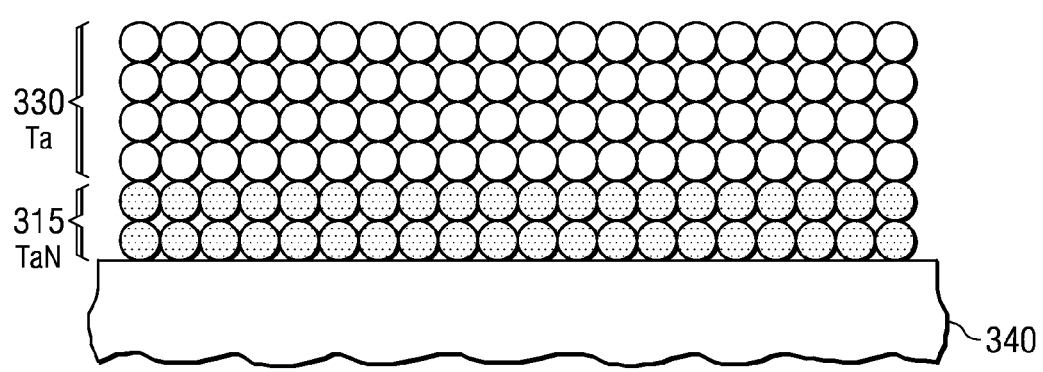
FIG. 3 shows a close-up of the structure of a TaN/Ta metal barrier layer as deposited using an exemplary embodiment of the present invention.

FIG. 3 shows a close-up of the structure of a TaN/Ta metal barrier layer as deposited using an exemplary embodiment of the present invention. TaN layer 315 was formed while nitrogen gas was present in the chamber. Since the nitrogen flow was turned off before or during the ignition step, but before the ignition step was complete, TaN layer 315 reaches only a limited thickness. Remaining Ta atoms were deposited in an alpha configuration forming a layer 330. Formation of layer 330 did not require a re-ignition because plasma flow had been sustained through the deposition. Ultra-thin nitride layer 315 serves as a good adhesion layer to substrate 340 and as a base layer for low-resistivity alpha-phase Ta formation. Additionally, electromigration and Copper-diffusion are improved. Furthermore, the immediate deposition of increasingly purer Ta layer 330 ensures enhanced wettability characteristics. This is particularly useful as the TaN layer.

Ignition is a temperamental process, thus reducing the number of ignition steps is advantageous. The pressure, temperature, and power applied to electrodes in the chamber must be carefully tuned for proper ignition, adding time and energy for multiple ignitions. Additionally, an advantage of the present invention is that sputtering can achieve ultra-thin barrier layers, thus there is no need to resort to other processes such as CVD or ALD. Sputtering is the favored technique for depositing materials, particularly metals and metal-based materials, Sputtering has a high deposition rate and, in most cases, uses relatively simple and inexpensive fabrication equipment and relatively inexpensive material precursors, targets in the case of PVD. Sputtering is advantageous in that materials can be deposited with improved properties compared to the substrate material. Furthermore, almost any type of inorganic material can be used as well as some kinds of organic materials. Also, the sputtering process is more environmentally friendly than processes such as electroplating.

TaN is not the only nitrided compound that can utilize the present invention. The concept can be applied to other barrier metals and reactive gases. For example, barrier layers can be formed using Ru-O with pure Ru, Titanium Silicide-Nitrogen with pure Ti(Si), as well as other combinations of metals. Furthermore, the foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for physical vapor deposition comprising:
   providing a first material to be deposited;
   providing a second material to be deposited in combination with the first material;
   wherein the second material is only provided before the beginning of a post-ignition deposition.

2. The method of claim 1, wherein the first material is Ta, Ti, or any combination thereof.

3. The method of claim 1, wherein the second material is nitrogen.

4. The method of claim 1, wherein the second material is only provided before an ignition step begins.

5. The method of claim 4, wherein the first material is Ta, Ti, or any combination thereof.

6. The method of claim 5, wherein the second material is nitrogen.

7. A method for physical vapor deposition comprising:
   providing a first material to be deposited on a substrate within a chamber;
   flowing a gaseous second material to be deposited in combination with the first material on the substrate;
   igniting a plasma within the chamber; and
   stopping the flow of the gaseous second material before post-ignition deposition begins.

8. The method of claim 7, wherein the first material is Ta, Ti, or any combination thereof.

9. The method of claim 7, wherein the gaseous second material is nitrogen.

10. The method of claim 7, wherein the gaseous second material is only provided before the ignition step begins.

11. The method of claim 10, wherein the first material is Ta, Ti, or combinations thereof.

12. The method of claim 10, wherein the second material is nitrogen.

13. A method for physical vapor deposition comprising:
   providing a target element composed of a first material to be deposited on a substrate within a chamber;
   flowing a gaseous second material into the chamber;
   applying an electric field between the target element and the substrate;
   igniting a plasma within the chamber; and
   stopping the flow of the gaseous second material is before the formation of a continuous plasma flow.

14. The method of claim 13, further comprising:
   stopping the flow of the gaseous second material before igniting the plasma.

15. The method of claim 13, wherein the gaseous second material is nitrogen.

16. The method of claim 13, wherein the first material is Ta, Ti, or any combination thereof.

* * * * *